(12) United States Patent
Umayahara et al.

(10) Patent No.: US 9,040,177 B2
(45) Date of Patent: *May 26, 2015

(54) DOPANT HOST

(71) Applicant: NIPPON ELECTRIC GLASS CO., LTD., Otsu (JP)

(72) Inventors: Yoshio Umayahara, Otsu (JP); Ryota Suzuki, Otsu (JP); Yoshikatsu Nishikawa, Otsu (JP); Masaru Ikebe, Otsu (JP); Hiroki Mori, Otsu (JP); Yoshinori Hasegawa, Otsu (JP)

(73) Assignee: Nippon Electric Glass Co., Ltd., Otsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/163,708

(22) Filed: Jan. 24, 2014

(65) Prior Publication Data

US 2014/0141258 A1 May 22, 2014

Related U.S. Application Data

(62) Division of application No. 12/450,934, filed on Oct. 19, 2009, now abandoned.

(30) Foreign Application Priority Data

| Nov. 9, 2007 | (JP) | 2007-291423 |
| Dec. 25, 2007 | (JP) | 2007-332001 |
| Aug. 20, 2008 | (JP) | 2008-211399 |
| Sep. 25, 2008 | (JP) | 2008-245100 |

(51) Int. Cl.

| *B32B 19/00* | (2006.01) |
| *B32B 9/04* | (2006.01) |
| *C03C 3/091* | (2006.01) |
| *C03C 3/085* | (2006.01) |
| *B32B 13/04* | (2006.01) |
| *B32B 9/00* | (2006.01) |
| *B32B 15/04* | (2006.01) |
| *B32B 17/06* | (2006.01) |
| *C03C 3/064* | (2006.01) |
| *C04B 35/117* | (2006.01) |
| *H01L 21/22* | (2006.01) |

(52) U.S. Cl.

CPC ............. *B32B 17/06* (2013.01); *C03C 3/064* (2013.01); *C03C 3/091* (2013.01); *C04B 35/117* (2013.01); *C04B 2235/3206* (2013.01); *C04B 2235/3208* (2013.01); *C04B 2235/3213* (2013.01); *C04B 2235/3215* (2013.01); *C04B 2235/3409* (2013.01); *C04B 2235/3418* (2013.01); *C04B 2235/36* (2013.01); *H01L 21/2225* (2013.01)

(58) Field of Classification Search
USPC .............. 428/446, 469, 699, 701; 501/66, 69
See application file for complete search history.

(56) References Cited

U.S. PATENT DOCUMENTS

| 3,907,618 A | 9/1975 | Rapp | 148/189 |
| 3,928,096 A | 12/1975 | Vergano et al. | 148/189 |
| 3,961,969 A | 6/1976 | Rapp | 501/8 |
| 3,998,667 A | 12/1976 | Rapp | 148/22 |
| 4,282,282 A | 8/1981 | Rapp | 428/220 |
| 4,588,455 A * | 5/1986 | Genser | 438/567 |
| 4,846,902 A | 7/1989 | Pickrell | 148/33 |
| 5,635,422 A * | 6/1997 | Lojek | 438/567 |
| 8,828,550 B2 * | 9/2014 | Suzuki et al. | 428/446 |
| 2006/0246322 A1 | 11/2006 | Kawada et al. | 428/701 |

FOREIGN PATENT DOCUMENTS

| JP | 50-122171 | 9/1975 |
| JP | 52-055861 | 5/1977 |
| JP | 54-018669 | 2/1979 |
| JP | 01-319932 | 12/1989 |
| JP | 02-044716 A | 2/1990 |
| JP | 2002-093734 | 3/2002 |

* cited by examiner

Primary Examiner — Jonathan Langman
(74) Attorney, Agent, or Firm — Kubovcik & Kubovcik

(57) ABSTRACT

A dopant host containing, in terms of mole %, 20 to 50% $SiO_2$, 30 to 60% (exclusive of 30%) $Al_2O_3$, 10 to 40% $B_2O_3$, and 2 to 10% RO, wherein R represents alkaline earth metal, or being a laminate including a boron component volatilization layer containing, in terms of mole %, 30 to 60% $SiO_2$, 10 to 30% $Al_2O_3$, 15 to 50% $B_2O_3$, and 2 to 10% RO, wherein R represents alkaline earth metal, and a heat resistant layer containing, in terms of mole %, 8 to 30% $SiO_2$, 50 to 85% $Al_2O_3$, 5 to 20% $B_2O_3$, and 0.5 to 7% RO, wherein R represents alkaline earth metal. A process for producing a boron dopant for a semiconductor including the steps of slurrying a starting material powder containing a boron-containing crystalline glass powder, forming the slurry to prepare a green sheet, and sintering the green sheet.

4 Claims, No Drawings

DOPANT HOST

This application is a division of application Ser. No. 12/450,934, filed Oct. 19, 2009, which is a 371 of international application PCT/JP2008/069552, filed Oct. 28, 2008 which claims priority based on Japanese Patent Application Nos. 2007-291423, 2007-332001, 2008-211399 and 2008-245100, filed Nov. 9, 2007, Dec. 25, 2007, Aug. 20, 2008 and Sep. 25, 2008, respectively, and which are incorporated herein by reference.

TECHNICAL FIELD

The present invention relates to a dopant host which is utilized in obtaining a p-type semiconductor by diffusion of boron into a silicon semiconductor and a process for producing the dopant host. The present invention also relates to a process for producing a dopant for doping a semiconductor with boron. More particularly, it relates to a process for producing a boron dopant for semiconductor by rendering a glass powder containing boron into a slurry, forming the slurry into a green sheet and then sintering the green sheet into a wafer form.

BACKGROUND ART

Various techniques by which a p-type region is formed on a surface of a silicon semiconductor substrate have been conventionally known, including dopant host, counter BN and thermal decomposition techniques.

The dopant host technique is a technique which involves positioning a wafer of $B_2O_3$-containing glass-ceramic and a semiconductor wafer parallel to each other in spaced confronting relationship, allowing $B_2O_3$ vaporized from the glass-ceramic to deposit on the semiconductor wafer and then thermally diffuse therein (see, for example, Patent Document 1). The counter BN technique is almost the same as the dopant host technique but differs therefrom by the use of a boron nitride wafer which has been subjected to an activation treatment (converting BN to $B_2O_3$), instead of using the glass-ceramic. The thermal decomposition technique is a technique which involves vaporizing liquid-form $BCl_3$, $BBr_3$ and others through bubbling and allowing the vapor to deposit on a preheated semiconductor wafer and then decompose to obtain a deposition film of $B_2O_3$, followed by thermal diffusion.

According to the procedure disclosed in Patent Document 1, the dopant host technique can be carried out at a lower process cost compared to the case of using boron nitride, because there is no need to perform the activation treatment when a dopant host is used. The thermal decomposition technique involves deposition of a gas on a semiconductor wafer and accordingly raises a problem that the deposit variation becomes large when $B_2O_3$ is diffused into a large-sized wafer. However, diffusion of $B_2O_3$ is maintained at a low degree of variation by the dopant host technique in which a silicon wafer and a glass-ceramic wafer having the same areal size are positioned in a confronting relationship and then subjected to a heat treatment.

Boron dopants for a semiconductor have been conventionally proposed for doping a silicon substrate or the like with boron, including those produced by sintering a boron nitride powder and those of crystallized glass type that are produced by crystallizing a molded glass containing boron and then cutting it into the wafer form (see, for example, Patent Document 2). A doping process is employed which involves heating a surface of a boron dopant for semiconductor in an oxidizing atmosphere to vaporize $B_2O_3$ and allowing $B_2O_3$ to deposit on a surface of a substrate located opposite to the boron dopant's surface, such as a silicon wafer, and then diffuse into the substrate.

The boron dopant for a semiconductor is required to have the following properties; (1) it can liberate a boron vapor from its surface when heated so that boron is allowed to diffuse sufficiently into a substrate, such as a silicon wafer, located opposite to the dopant, (2) it is durable for repeated use, (3) it can liberate a consistent amount of the boron vapor at each use, and (4) it can be readily processed into the same shape as the substrate.

Patent Document 1: Japanese Paten Laid-Open No. Sho 52-55861

Patent Document 2: Japanese Paten Laid-Open No. 2002-93734

DISCLOSURE OF THE INVENTION

Because the dopant host material disclosed in Patent Document 1 is not very high in heat resistance, the glass-ceramic wafer gradually warps as the heat treatment is repeated. This causes uneven diffusion of $B_2O_3$ or lowers a yield due to the contact of the glass-ceramic wafer with the silicon wafer, which has been a problem. Also because the amount of $B_2O_3$ vaporized from the dopant host material is smaller than from the activated boron nitride wafer, there has been a problem of poor thermal diffusion efficiency.

Accordingly, it is a first object of the present invention to provide a dopant host which has high heat resistance and liberates a large amount of a $B_2O_3$ vapor.

The boron dopant for a semiconductor, if comprising a sintered body of a boron nitride powder, liberates an excess amount of a boron vapor. This necessitates frequent cleaning of boron doping facilities and also gives a marked damage to a substrate such as a silicon wafer in the doping process, which have been problems. The boron dopant for a semiconductor is normally subjected to a heat treatment prior to its use, for the purpose of inducing sufficient evaporation of boron. However, in the case of the dopant produced by sintering a boron nitride powder, such a heat treatment must be carried out prior to almost every use.

On the other hand, the dopant using a crystallized glass has an advantage that the damage to the substrate is relatively small. Another advantage is that once an initial heat treatment is carried out prior to use, further heat treatment is seldom required. However, if the above-described requirement (3) is to be satisfied, a glass must be homogeneously melted and cast into a destined shape. Particularly in the preparation of a large cast body for use in the production of large-sized wafers, it is hard to control bubbles and devitrification of the cast body, resulting in the difficulty to obtain a homogeneous crystallized glass. Another problem is an increase in cost of facilities and the like.

Accordingly, a second object of the present invention is to provide a boron dopant for a semiconductor which is homogeneous, liberates a consistent amount of a boron vapor at every use and is inexpensive.

First Aspect of the Invention

The inventors of this application have discovered after their intensive studies that a dopant host having a specific composition or containing a specific crystal can solve the above-described problems and proposed the first aspect of the present invention.

That is, the dopant host of the first aspect of the present invention is characterized as having a composition comprising 20-50% by mole of $SiO_2$, 30-60% by mole (exclusive of 30% by mole) of $Al_2O_3$, 10-40% by mole of $B_2O_3$ and 2-10% by mole of RO (wherein R denotes an alkaline earth metal). The dopant host of the present invention has a composition containing $Al_2O_3$ in a large proportion, 30-60% by mole. $Al_2O_3$ is partly or mostly contained in the form of an $Al_4B_2O_9$ (aluminum borate: $2Al_2O_3.B_2O_3$) crystal. As a result, the dopant host of the present invention characteristically has high heat resistance and liberates a large amount of a $B_2O_3$ vapor.

Secondly, the dopant host of the present invention is characterized as containing 20-50% by mass of an $Al_4B_2O_9$ crystal phase, 20-80% by mass of a glass phase and 0-60% by mass of an $Al_2O_3$ crystal phase. Characteristically, the dopant host of the present invention contains $Al_4B_2O_9$ crystals. The $Al_4B_2O_9$ crystal is a prismatic crystal having a relatively large size. These crystals form a homogeneously and sterically entangled structure (three-dimensional network structure) in the dopant host. Accordingly, very high heat resistance is imparted to the dopant host. Also, the presence of a number of void spaces around each crystal markedly increases the amount of $B_2O_3$ vaporized. Due to the precipitation of such $Al_4B_2O_9$ crystals in a large proportion, 20-50% by mass, as described above, the dopant host of the present invention exhibits higher heat resistance as well as liberates a larger amount of $B_2O_3$ vapor, compared to conventional dopant host materials.

Thirdly, the dopant host of the present invention is characterized as containing $Al_4B_2O_9$ crystals having a major diameter of not less than 3 μm. Basically, the larger major diameter of the $Al_4B_2O_9$ crystal increases the tendency of those crystals to entangle strongly with each other and also increases the number of void spaces between them and as a result, tends to enhance the heat resistance of the dopant host and increase the amount of $B_2O_3$ vaporized therefrom.

Fourthly, the present invention relates to a process for producing the aforesaid dopant host. Characteristically, a mixed powder containing 40-90% by mass of a $B_2O_3$-containing crystallizable glass powder and 10-60% by mass of an alumina powder is sintered. A sequence of mixing and sintering of the $B_2O_3$-containing crystallizable glass powder and the alumina powder renders them more reactive to each other and thereby promotes precipitation of $Al_4B_2O_9$ crystals. As a result, a dopant host can be obtained which exhibits high heat resistance and liberates a large amount of $B_2O_3$ vapor.

Fifthly, the process for producing the dopant host, in accordance with the present invention, is characterized in that the $B_2O_3$-containing crystallizable glass powder and the alumina powder have a median particle diameters $D_{50}$ of 0.1-10 μm. The $B_2O_3$-containing crystallizable glass powder and the alumina powder, if both rendered into fine particles of 0.1-10 μm, mixed and then sintered, increase their contact area to thereby further promote precipitation of $Al_4B_2O_9$ crystals. Accordingly, the resulting dopant host exhibits better heat resistance and liberates a further larger amount of $B_2O_3$ vapor.

Sixthly, the dopant host of the present invention is characterized in that it is produced by the aforesaid method.

Second Aspect of the Invention

The inventors of this application have discovered after their intensive studies that the above-described problems can be solved by a dopant host which has a laminated structure comprising a boron component vaporization layer and a heat resistant layer, and proposed the second aspect of the present invention.

That is, the second aspect of the present invention relates to a dopant host which is characterized as comprising a laminate including a boron component vaporization layer having a composition comprising 30-60% by mole of $SiO_2$, 10-30% by mole of $Al_2O_3$, 15-50% by mole of $B_2O_3$ and 2-10% by mole of RO (wherein R denotes an alkaline earth metal) and a heat resistant layer having a composition comprising 8-30% by mole of $SiO_2$, 50-85% by mole of $Al_2O_3$, 5-20% by mole of $B_2O_3$ and 0.5-7% by mole of RO (wherein R denotes an alkaline earth metal).

In the dopant host of the present invention, the boron component vaporization layer has a high $B_2O_3$ content of 15-50% by mole and has a high capability of vaporizing $B_2O_3$. The boron component is vaporized from the $B_2O_3$-containing crystals contained in the boron component vaporization layer or from $B_2O_3$ in the glass composition. On the other hand, the heat resistant layer has a high $Al_2O_3$ content of 50-80% by mole and, for example, has a superior heat resistance of at least 1,200° C. Due to the inclusion of such plural layers having different compositions, the dopant host of the present invention can be imparted thereto the enhanced heat resistance and the ability to liberate a larger amount of $B_2O_3$ vapor, compared to conventional dopant host materials.

Secondly, the dopant host of the present invention preferably has an outermost layer constituted by the boron component vaporization layer.

By allowing the boron component vaporization layer having an excellent $B_2O_3$ vapor liberating capability to serve as the outermost layer, a dopant host can be obtained which liberates a further larger amount of $B_2O_3$ vapor.

Thirdly, the dopant host of the present invention is preferably obtained by sintering a laminate of green sheets.

The use of such laminated green sheets eases production of a structure consisting of two or more layers having different compositions. Also, the dopant host having a desired size can be easily produced by suitably selecting a size of the green sheets used. Also, it is not necessary to follow the steps of preparing a glass-ceramic ingot and cutting it into wafers, as practiced heretofore. This characteristically enables cost reduction.

Third Aspect of the Invention

The inventors of this application have discovered after their intensive studies that the above-described problems can be solved by rendering a boron-containing crystallizable glass powder into a slurry, forming the slurry into a green sheet and then sintering the green sheet, and proposed the third aspect of the present invention. The "boron-containing crystallizable glass powder", as used herein, refers to a glass powder which contains boron as a component and has a property of precipitating crystals when subjected to a heat treatment.

That is, the process for producing a boron dopant for a semiconductor, in accordance with the third aspect of the present invention, includes the steps of rendering a raw material powder containing a boron-containing crystallizable glass powder into a slurry, forming the slurry into a green sheet and sintering the green sheet.

The production process of the present invention is characterized in that it produces a boron dopant for a semiconductor by sintering and crystallizing the glass powder in the green sheet form, as contrary to conventional processes in which a cast glass body is crystallized. The glass powder for use in this process is obtained via a procedure wherein a raw material powder for glass is melted for vitrification, formed, pulverized and then classified. Accordingly, even if the raw material glass obtained subsequent to the melting includes bubbles or reams or shows poor homogeneity, such problems can be solved by allowing the raw material glass to go through the sequence of pulverizing, classifying and sintering and as a result, a homogeneous sintered body of glass can be obtained. In this way, the production process of the present invention can eliminate the need of providing a precise control of bubbles, reams and homogeneity during production of the glass. As a result, a melting cost can be reduced.

In the case where a large-sized wafer is produced by a conventional production process, because a molded glass increases in heat capacity and accordingly becomes hard to cool down, a probability of precipitating an improper devitrified substance increases. This has been a problem because the devitrified substance, if precipitated, serves as a nuclei in the following crystallization process to promote formation of large size crystals, resulting in the difficulty to obtain crystals of uniform size. Accordingly, it has been difficult to produce a large-sized boron dopant for a semiconductor, specifically having a diameter of not less than 100 mm. However, in accordance with the production process of the present invention, a boron dopant for a semiconductor can be easily produced which has a desired size corresponding to that of the green sheet to be prepared. Also, a boron dopant for a semiconductor having a desired thickness can be easily obtained by adjusting a thickness of the green sheet or sintering a laminate of plural green sheets.

Further, conventional production processes have been required to cut a cast body of crystallized glass into a wafer form. However, in accordance with the production process of the present invention, a cutting loss that occurs in cutting the cast body into a wafer form can be eliminated to increase a material efficiency. Accordingly, a boron dopant for a semiconductor can be produced at a low cost.

Secondly, the process of the present invention for producing a boron dopant for a semiconductor is characterized in that the green sheets are laminated and sintered.

Thirdly, the process of the present invention for producing a boron dopant for a semiconductor is characterized in that the boron-containing crystallizable glass powder has a median particle diameter $D_{50}$ of 0.1-10 µm.

Fourthly, the process of the present invention for producing a boron dopant for a semiconductor is characterized in that the boron-containing crystallizable glass powder contains 15-45% by mass of $B_2O_3$ as a glass component.

Fifthly, the process of the present invention for producing a boron dopant for a semiconductor is characterized in that the boron-containing crystallizable glass powder comprises a $B_2O_3$—$SiO_2$—$Al_2O_3$ based glass or a $B_2O_3$—$Al_2O_3$—$BaO$ based glass. The "$B_2O_3$—$SiO_2$—$Al_2O_3$ based glass", as used herein, refers to a glass which has a composition containing $B_2O_3$, $SiO_2$ and $Al_2O_3$ as its essential glass components. The "$B_2O_3$—$Al_2O_3$—$BaO$ based glass" refers to a glass which has a composition containing $B_2O_3$, $Al_2O_3$ and $BaO$ as its essential glass components.

Sixthly, the process of the present invention for producing a boron dopant for a semiconductor is characterized in that the raw material powder contains 1-60% by mass of an alumina powder.

Inclusion of the alumina powder in the raw material powder further enhances the mechanical strength or heat resistance of the resulting boron dopant for a semiconductor. In particular, the boron dopant for a semiconductor, even when rendered into a large-sized form, shows advantages of reduced occurrence of warpage when in use and superior heat resistance.

Seventhly, the process of the present invention for producing a boron dopant for a semiconductor is characterized in that the green sheet has a thickness of 30-1,500 µm.

Eighthly, the process of the present invention for producing a boron dopant for a semiconductor is characterized in that the slurry has a viscosity of 1-50 Pa·s.

Ninethly, the process of the present invention for producing a boron dopant for a semiconductor is characterized in that two or more types of green sheets containing different components are laminated.

Laminating two or more types of green sheets containing different components can result, for example, in the production of a boron dopant for a semiconductor which has superior mechanical strength or heat resistance while keeping its ability to vaporize boron.

Tenthly, the process of the present invention for producing a boron dopant for a semiconductor is characterized in that a green sheet comprising an alumina powder is laminated.

With such a construction employed, the boron dopant for a semiconductor even when rendered into a large-sized form shows advantages of reduced occurrence of warpage when in use and superior heat resistance.

Eleventhly, the boron dopant for a semiconductor of the present invention is characterized in that it is produced by any of the preceding production processes.

Twelfthly, the present invention relates to a boron dopant for a semiconductor which has a laminated structure including plural sintered body layers of an inorganic powder and which is characterized in that a part or whole of the sintered body layers of an inorganic powder comprises a sintered body of an inorganic powder containing a boron-containing crystallizable glass powder.

Thirteenthly, the boron dopant for a semiconductor of the present invention is characterized in that it has a thickness of 0.5-10 mm and a diameter of 50-300 mm.

BEST MODE FOR CARRYING OUT THE INVENTION

First Aspect of the Invention

The dopant host in accordance with the first aspect of the present invention is characterized in that it has a composition comprising 20-50% by mole of $SiO_2$, 30-60% by mole (but exclusive of 30% by mole) of $Al_2O_3$, 10-40% by mole of $B_2O_3$, and 2-10% by mole of RO (wherein R denotes an alkaline earth metal).

The reason for which each component was contained in the amount specified above is below described in detail.

$SiO_2$ is a basic component which constitutes a network of a glass. Its content is 20-50% by mole, preferably 20-45% by mole. If the $SiO_2$ content is below 20% by mole, vitrification tends to become hard to occur. On the other hand, if it exceeds 50% by mole, a softening point of a glass increases to reduce its fusibility, likely resulting in the difficulty to carry out forming of the glass.

$Al_2O_3$ is a component which constitutes the $Al_4B_2O_9$ crystal and, together with $SiO_2$, constitutes a network of a glass phase. Its content is 30-60% by mole (but exclusive of 30% by mole), preferably 30-50% by mole. If the $Al_2O_3$ content is 30% or below 30% by mole, the $Al_4B_2O_9$ crystal content decreases, leading likely to the insufficient heat resistance of the dopant host and the insufficient amount of $B_2O_3$ vaporized from the dopant host. On the other hand, if the $Al_2O_3$ content exceeds 60% by mole, the dopant host increases in porosity to reduce its strength.

$B_2O_3$ is a component which constitutes the $Al_4B_2O_9$ crystal. Its content is 10-40% by mole, preferably 15-30% by mole. If the $B_2O_3$ content is below 15% by mole, the $Al_4B_2O_9$ crystal content decreases, leading likely to the insufficient heat resistance of the dopant host and the insufficient amount of $B_2O_3$ vaporized from the dopant host. On the other hand, even if the $B_2O_3$ content exceeds 40% by mole, an increase of the $Al_4B_2O_9$ crystal content can not be expected. It may rather restrain precipitation of such crystals.

RO is a component which promotes vitrification. RO can be selected from MgO, CaO, SrO and BaO. These may be used alone or in combination. The RO content (total content) is 2-10% by mole, preferably 2.5-10% by mole. If the RO content is below 2% by mole, vitrification tends to be retarded. On the other hand, if the RO content exceeds 10% by mole, a probability of precipitating a desired crystal tends to be lowered.

The dopant host of the present invention is characterized as containing 20-50% by mass of an $Al_4B_2O_9$ crystal phase, 20-80% by mass of a glass phase and 0-60% by mass of an $Al_2O_3$ crystal phase.

As described earlier, the dopant host of the present invention is characterized as containing a specific amount of $Al_4B_2O_9$ crystals. Because these $Al_4B_2O_9$ crystals assume a three-dimensionally entangled structure in the dopant host, the dopant host exhibits satisfactory heat resistance and liberates a satisfactory amount of the $B_2O_3$ vapor. The $Al_4B_2O_9$ crystal content is 20-50% by mass, preferably 30-50% by mass. If the $Al_4B_2O_9$ crystal content falls below 20% by mass, the heat resistance of the dopant host as well as the amount of $B_2O_3$ vaporized from the dopant host tend to become insufficient. On the other hand, if the $Al_4B_2O_9$ crystal content exceeds 50% by mass, a porosity of the dopant host becomes high to such excess that lowers strength of the dopant host.

The $Al_4B_2O_9$ crystals preferably include those having a major diameter of not less than 3 μm, more preferably not less than 5 μm. If the $Al_4B_2O_9$ crystals all have a major diameter of less than 3 μm, they become difficult to form a structure in which individual crystals are sterically entangled with each other. Then, such crystals are allowed to readily flow in the glass. As a result, the heat resistance of the dopant host is lowered. Due also to the difficulty to form void spaces around the crystals, the amount of $B_2O_3$ vaporized from the dopant host tends to decrease. A minor diameter of the $Al_4B_2O_9$ crystals is not particularly specified but preferably not less than 0.5 μm. With such minor diameter, those crystals are better associated with each other to form a three-dimensional network structure.

Besides the $Al_4B_2O_9$ crystal phase, the dopant host contains the glass phase and the $Al_2O_3$ crystal phase (α-corundum crystal phase: an unreacted portion of the alumina powder added in the production of the dopant host). The glass phase and the $Al_2O_3$ crystal phase are contained in the amounts of 20-80% by mass and 0-60% by mass, respectively. Preferably, the glass phase and the $Al_2O_3$ crystal phase are contained in the amounts of 20-70% by mass and 0-50% by mass, respectively.

The dopant host of the present invention can also be obtained by subjecting only a glass containing $B_2O_3$ and $Al_2O_3$ to a heat treatment to precipitate $Al_4B_2O_9$ crystals. However, when such a process is utilized, the crystals tends to become hard to grow to a large size and the amount of the crystals precipitated tends to be low. Precipitation of the $Al_4B_2O_9$ crystals in a large amount can be now realized by sintering a mixed powder containing a $B_2O_3$-containing crystallizable glass powder and an alumina powder to thereby allow $B_2O_3$ in the $B_2O_3$-containing crystallizable glass powder to react with the alumina powder.

An example of the $B_2O_3$-containing crystallizable glass powder is a glass powder containing at least three components; $SiO_2$, $B_2O_3$ and RO (wherein R denotes an alkaline earth metal). Preferably, the glass powder further contains $Al_2O_3$ as a glass component. Inclusion thereof renders the glass powder more reactive with the alumina powder to precipitate $Al_4B_2O_9$ crystals. Specifically, the $B_2O_3$-containing crystallizable glass powder preferably has a composition comprising 20-60% by mole of $SiO_2$, 10-40% by mole of $Al_2O_3$, 10-50% by mole of $B_2O_3$ and 2-15% by mole of RO.

The reason for which each component was contained in the amount specified above is below described in detail.

$SiO_2$ is a basic component which constitutes a network of a glass. Its content is 20-60% by mole, preferably 30-50% by mole. If the $SiO_2$ content is below 20% by mole, vitrification tends to become hard to occur. On the other hand, if it exceeds 60% by mole, a softening point of a glass increases to reduce its fusibility, likely resulting in the difficulty to perform forming of the glass.

$Al_2O_3$ is a component which facilitates precipitation of $Al_4B_2O_9$ crystals and constitutes the $Al_4B_2O_9$ crystal. Together with $SiO_2$, it also constitute a network of a glass phase. Its content is 0-40% by mole, preferably 10-40% by mole, more preferably 10-30% by mole. If the $Al_2O_3$ content is below 10% by mole, precipitation of $Al_4B_2O_9$ crystals tends to be retarded. On the other hand, if the $Al_2O_3$ content exceeds 40% by mole, vitrification of the glass is more induced, likely resulting in the difficulty to perform forming of the glass.

$B_2O_3$ is an essential component for precipitating the $Al_4B_2O_9$ crystals. Its content is 10-50% by mole, preferably 15-40% by mole. If the $B_2O_3$ content is below 10% by mole, precipitation of $Al_4B_2O_9$ crystals tends to develop insufficiently. On the other hand, even if the $B_2O_3$ content exceeds 50% by mole, an increase of the $Al_4B_2O_9$ crystal content can not be expected. It rather tends to restrain precipitation of such crystals.

RO is a component which promotes vitrification. RO can be selected from MgO, CaO, SrO and BaO. These may be used alone or in combination. The RO content (total content) is 2-15% by mole, preferably 3-13% by mole. If the RO content is below 2% by mole, vitrification tends to be retarded. On the other hand, if the RO content exceeds 15% by mole, precipitation of desired crystals tends to become difficult to proceed.

The mixed powder preferably contains 40-90% by mass of the $B_2O_3$-containing crystallizable glass powder and 10-60% by mass of the alumina powder. More preferably, it contains 50-80% by mass of the $B_2O_3$-containing crystallizable glass powder and 20-50% by mass of the alumina powder. If the alumina powder content is below 10% by mass, the $Al_4B_2O_9$ crystals tends to be less precipitated. On the other hand, even if the alumina powder content exceeds 60% by mass, a further increase in amount of the $Al_4B_2O_9$ crystals precipitated can not be expected. It rather tends to restrain precipitation of the $Al_4B_2O_9$ crystals.

The $B_2O_3$-containing crystallizable glass powder and the alumina powder preferably have a median particle diameters $D_{50}$ of 0.1-10 μm, more preferably 0.5-8 μm, further preferably 1-5 μm. If the median particle diameters $D_{50}$ of each powder falls below 0.1 μm, not only a production cost increases, but also formability decreases. On the other hand, if the median particle diameters $D_{50}$ of each powder exceeds 10 µm, a reaction between the powders tends to become insufficient to reduce the amount of the $Al_4B_2O_9$ crystals precipitated.

A sintering temperature of the mixed powder including the $B_2O_3$-containing crystallizable glass powder and the alumina powder is not particularly limited, so long as it not only induces sufficient integration of the powders via sintering but also allows precipitation of $Al_4B_2O_9$ crystals, and may preferably be 900-1,300° C., for example.

The dopant host of the present invention can be produced, for example, by a process which includes rendering a raw material powder into a slurry, processing the slurry into plural bodies shaped in the green sheet form, laminating them and sintering the laminate for integration into a wafer form. This process excludes cutting and polishing steps required for conventional production processes, thereby improving a yield.

Second Aspect of the Invention

The dopant host in accordance with the second aspect of the present invention is characterized as comprising a laminated structure including a boron component vaporization layer and a heat resistant layer. The boron component vaporization layer has a composition comprising 30-60% by mole of $SiO_2$, 10-30% by mole of $Al_2O_3$, 15-50% by mole of $B_2O_3$ and 2-10% by mole of RO (wherein R denotes an alkaline earth metal) and the heat resistant layer has a composition comprising 8-30% by mole of $SiO_2$, 50-85% by mole of $Al_2O_3$, 5-20% by mole of $B_2O_3$ and 0.5-7% by mole of RO (wherein R denotes an alkaline earth metal).

First, the reason for which each component of the boron component vaporization layer is contained in the amount specified above is below described.

$SiO_2$ is a basic component which constitutes a network of a glass. The $SiO_2$ content is 30-60% by mole, preferably 35-45% by mole. If the $SiO_2$ content falls below 30% by mole, the chemical durability of the dopant host shows a declining tendency. On the other hand, if the $SiO_2$ content exceeds 60% by mole, a softening point of a glass increases to reduce its fusibility, likely resulting in the difficulty to achieve forming of the glass.

$Al_2O_3$ is a component which, together with $SiO_2$, constitute a network of a glass phase. The $Al_2O_3$ content is 10-30% by mole, preferably 15-25% by mole. If the $Al_2O_3$ content falls below 10% by mole, the chemical durability of the dopant host shows a declining tendency. On the other hand, if the $Al_2O_3$ content goes beyond 30% by mole, the dopant host shows a tendency to increase in porosity and reduce its strength.

$B_2O_3$ is a volatile component. Its content is 15-50% by mole, preferably 20-40% by mole. If the $B_2O_3$ content falls below 15% by mole, the amount of $B_2O_3$ vaporized from the dopant host tends to become insufficient. On the other hand, if the $B_2O_3$ content exceeds 50% by mole, the chemical durability of the dopant host tends to deteriorate.

RO is a component which promotes vitrification. RO can be selected from MgO, CaO, SrO and BaO. These may be used alone or in combination. The RO content (total content) is 2-10% by mole, preferably 2.5-10% by mole. If the RO content falls below 2% by mole, vitrification tends to becomes hard to develop. On the other hand, if the RO content exceeds 10% by mole, the chemical durability of the dopant host tends to deteriorate.

Besides the above-specified components, the dopant host may further contain components such as $ZrO_2$ and $TiO_2$ within the total amount of 30% by mole for the purpose of improving the chemical durability.

Next, the reason for which each component of the heat resistant layer is contained in the amount specified above is below described.

$SiO_2$ is a basic component which constitutes a network of a glass. The $SiO_2$ content is 8-30% by mole, preferably 15-25% by mole. If the $SiO_2$ content falls below 8% by mole, the chemical durability of the dopant host shows a declining tendency. On the other hand, if the $SiO_2$ content exceeds 30% by mole, a softening point of a glass increases to result in the tendency of the boron vapor to decrease in amount.

$Al_2O_3$ is a main component which retains heat resistance as a crystal form. The $Al_2O_3$ content is 50-85% by mole, preferably 65-80% by mole. If the $Al_2O_3$ content falls below 50% by mole, the dopant host tends to reduce its heat resistance due to the decreasing amount of the $Al_2O_3$ crystals precipitated. On the other hand, if the $Al_2O_3$ content goes beyond 85% by mole, the dopant host tends to increase in porosity and reduce its strength.

$B_2O_3$ is a component which constitutes a glass. The $B_2O_3$ content is 5-20% by mole, preferably 5-15% by mole. If the $B_2O_3$ content falls below 5% by mole, the mechanical strength of the dopant host tends to be lowered due to insufficient sintering. On the other hand, if the $B_2O_3$ content exceeds 20% by mole, the dopant host decreases in heat resistance and becomes susceptible to deformation, for example, at a temperature below 1,200° C.

RO is a component which promotes vitrification. RO can be selected from MgO, CaO, SrO and BaO. These may be used alone or in combination. The RO content (total content) is 0.5-7% by mole, preferably 2.5-6% by mole. If the RO content falls below 0.5% by mole, vitrification tends to become hard to develop. On the other hand, if the RO content exceeds 7% by mole, the heat resistance of the dopant host tends to deteriorate.

Besides the above-specified components, the dopant host may further contain components such as $ZrO_2$ and $TiO_2$ within the total amount of 30% by mole for the purpose of improving heat resistance.

The dopant host of the present invention preferably contains $Al_4B_2O_9$ crystals. Because these $Al_4B_2O_9$ crystals have a needle-like structure and are sterically entangled with each other in the dopant host, the dopant host shows superior heat resistance and can liberate a satisfactory amount of a $B_2O_3$ vapor. The $Al_4B_2O_9$ content of the dopant host is preferably 20-50% by mass, more preferably 30-50% by mass. If the $Al_4B_2O_9$ content falls below 20% by mass, the heat resistance of the dopant host as well as the amount of $B_2O_3$ vaporized from the dopant host tend to become insufficient. On the other hand, if the $Al_4B_2O_9$ content exceeds 50% by mass, the dopant host tends to become excessively porous and reduce its strength.

Besides the $Al_4B_2O_9$ crystals, the dopant host may further contain $Al_2O_3$ crystals (α-corundum crystals) which constitute an unreacted portion of the raw alumina powder. The $Al_2O_3$ crystals are preferably contained in the dopant host in the amount of 0-60% by mass, more preferably 10-50% by mass.

In order to obtain a higher capability of vaporizing $B_2O_3$, the dopant host of the present invention preferably has the boron component vaporization layer as its outermost layer (surface layer), particularly preferably as its opposite outermost layers.

The laminating order of the boron component vaporization layers and heat resistant layers is not particularly specified. However, the boron component vaporization layers are preferably laminated alternately with the heat resistant layers, because of the easiness of providing a dopant host which has superior heat resistance and $B_2O_3$ vapor liberating capability.

The boron component vaporization layer preferably has a thickness of 50-1,000 μm, more preferably 100-500 μm. If the thickness of the boron component vaporization layer is below 50 μm, it becomes difficult to obtain a desired, $B_2O_3$ vapor liberating capability. On the other hand, if the thickness of the boron component vaporization layer exceeds 1,000 μm, cracking may occur.

The heat resistant layer preferably has a thickness of 200-2,000 μm, more preferably 500-1,000 μm. If the thickness of the heat resistant layer is below 200 μm, the dopant host tends to show inferior heat resistance. On the other hand, if the thickness of the heat resistant layer exceeds 2,000 μm, cracking may occur.

The process of the present invention for producing a dopant host, as embodied by utilizing a green sheet technique, is below described.

The following procedure is utilized to prepare a green sheet for the boron component vaporization layer.

First, a raw material powder containing $SiO_2$, $Al_2O_3$, $B_2O_3$ and RO is compounded to prepare a batch which is melted, for example, at nearly 1,600° C. for about an hour to cause vitrification. Thereafter, the resultant is formed, ground and then classified to obtain a glass powder.

Subsequently, a binder, a plasticizer, a solvent and others are added to the glass powder. The resulting mixture is then kneaded to render it into a slurry. An alumina powder may also be added to promote precipitation of $Al_4B_2O_9$ crystals.

Generally used as the binder is a thermoplastic resin. This thermoplastic resin is a component which enhances strength of a film when later dried and imparts flexibility thereto. The thermoplastic resin is generally contained in the slurry in the amount of 5-30% by mass. Examples of useful thermoplastic resins include acrylic resins such as polybutyl methacrylate, polymethyl methacrylate and polyethyl methacrylate, polyvinyl butyral and ethyl cellulose. These may be used alone or in combination.

The plasticizer is a component which not only controls a drying rate but also imparts flexibility to a film when later dried. The plasticizer is generally contained in the slurry in the amount of about 0-10% by mass. Examples of useful plasticizers include butylbenzyl phthalate, dioctyl phthalate, diisooctyl phthalate, dicapryl phthalate and dibutyl phthalate. These may be used alone or in combination.

The solvent is a component which renders the raw material into a paste and is generally contained in the slurry in the amount of about 10-50% by mass. Examples of useful solvents include terpineol, methyl ethyl ketone, diethylene glycol monobutyl ether acetate and 2,2,4-trimethyl-1,3-pentadiol monoisoburyrate. These may be used alone or in combination.

The obtained slurry is sheet formed on a polyethylene terephthalate (PET) or other film having superior mechanical and thermal stability, for example, by a doctor blade technique. The sheet formed article is then dried to remove the solvent and others so that it can be rendered into a green sheet.

Generally, the raw material powder accounts for about 60-95% by mass of the green sheet.

A thickness of the green sheet is preferably 30-1,500 μm, more preferably 50-1,000 μm, further preferably 100-500 μm, particularly preferably 150-300 μm. If the thickness of the green sheet is smaller than 30 μm, the tendency of the green sheet to separate from the support film increases. Also, such green sheets tends to become susceptible to breakage when they are laminated above each other. On the other hand, if the thickness of the green sheet is larger than 1,500 μm, cracking tends to occur when it is sheet formed.

The slurry when applied by a doctor blade preferably has a viscosity of 1-50 Pa·s, more preferably 2-30 Pa·s, further preferably 3-20 Pa·s. If the slurry viscosity is lower than 1 Pa·s, problems may arise which include the occurrence of craters during formation of the green sheet and the increased thickness variation of the green sheet. On the other hand, if the slurry viscosity is higher than 50 Pa·s, the flowability of the slurry decreases to result in the difficulty to obtain a homogeneous film due to formation of uneven portions or streaks on the green sheet. Also, a material loss tends to increase due to the increasing amount of the slurry deposited on tubings and vessels. The slurry viscosity can be adjusted by suitably selecting the respective amount of a binder, plasticizer and solvent.

The same procedure as used above in the preparation of the green sheet for the boron component vaporization layer may be followed, except using a mixture of a glass powder containing $SiO_2$, $B_2O_3$ and RO and an alumina powder as the raw material powder, to prepare the green sheet for the heat resistant layer.

The above-obtained two types of green sheets are laminated and compressively bonded for integration. A total number of the green sheets to be laminated may be suitably selected, for example, from the range of 3-100 or 5-50, depending on the thickness of each green sheet. The boron component vaporization layer, as well as the heat resistant layer, may comprise a single green sheet or plural green sheets. The obtained green sheets are cut into a desired shape, if necessary. The green sheets may be laminated either after or before they are cut into a desired shape.

Subsequent firing of the laminated green sheets results in obtaining a boron dopant for a semiconductor. A firing temperature is preferably 1,000-1,300° C., more preferably 1,100-1,200° C. A firing time may be suitably controlled depending on the firing temperature, for example, within the range of 0.5-10 hours or 1-8 hours.

Third Aspect of the Invention

The process for production of a boron dopant for a semiconductor, in accordance with the third aspect of the present invention, is characterized as including the steps of rendering a raw material powder containing a boron-containing crystallizable glass powder into a slurry, forming the slurry into a green sheet and sintering the green sheet.

In the present invention, the raw material powder is comprised mainly of the boron-containing crystallizable glass powder. The use of the boron-containing crystallizable glass powder results in obtaining a boron dopant for a semiconductor which comprises a sintered body of crystallized glass and enables the dopant host to maintain sufficient heat resistance when boron is vaporized therefrom when heated. The semiconductor dopant host, even when cut into wafers and placed in service, can be prevented from softening or deforming when heated.

A $B_2O_3$ content of the boron-containing crystallizable glass powder is preferably 15-45% by mass, more preferably 18-40% by mass. If the $B_2O_3$ content falls below 15% by mass, the amount of boron vaporized toward a substrate tends to become insufficient. Also, the vaporization temperature tends to increase. On the other hand, if the $B_2O_3$ content exceeds 45% by mass, the boron dopant for a semiconductor tends to reduce its strength when boron is vaporized by heating and increase its tendency to warp during a heat treatment.

Specific examples of boron-containing crystallizable glass powders include, but not limited to, $B_2O_3$—$SiO_2$—$Al_2O_3$ based glasses and $B_2O_3$—$Al_2O_3$—$BaO$ based glasses. The use of these glasses eases production of a boron dopant for a semiconductor which exhibits high heat resistance and liberates a large amount of the boron vapor.

A median particle diameter $D_{50}$ of the boron-containing crystallizable glass powder is preferably 0.1-10 μm, more preferably 0.5-8 μm, further preferably 1-5 μm. If the median particle diameter $D_{50}$ is smaller than 0.1 μm, it becomes likely that grinding is rendered hard to perform, a production cost increases and forming is rendered difficult to achieve. On the other hand, if the median particle diameter $D_{50}$ is larger than 10 μm, sintering tends to become insufficient due to the reduced denseness of the green sheet.

In the present invention, the median particle diameter $D_{50}$ is measured using a measuring device according to a laser diffraction scattering method.

In the present invention, the raw material powder may contain an alumina powder in order to improve mechanical strength and heat resistance of the boron dopant for a semiconductor. The alumina content of the raw material powder is preferably 1-60% by mass, more preferably 5-40% by mass, further preferably 10-30% by mass. If the alumina content is less than 1% by mass, a desired effect may not be obtained. On the other hand, if the alumina content exceeds 60% by mass, sintering tends to become insufficient.

A metal oxide powder other than the alumina powder, a silica powder or a glass powder may be added optionally. If such is the case, they may preferably be added in the raw material powder within a total amount of 30% by mass. If the amount thereof exceed 30% by mass, sintering tends to become insufficient.

The boron-containing crystallizable glass powder can be obtained by compounding a $B_2O_3$-containing raw material powder to prepare a batch, melting the batch, for example, at a temperature of nearly 1,600° C. for about an hour to cause vitrification, subjecting the resultant to a sequence of forming, grinding and classifying.

The raw material powder including the boron-containing crystallizable glass powder can be rendered into a slurry by adding thereto a binder, a plasticizer, a solvent and others and then kneading the resulting mixture.

Generally used as the binder is a thermoplastic resin. This thermoplastic resin is a component which enhances strength of a film when later dried and imparts flexibility thereto. The thermoplastic resin is generally contained in the slurry in the amount of 5-30% by mass. Examples of useful thermoplastic resins include acrylic resins such as polybutyl methacrylate, polymethyl methacrylate and polyethyl methacrylate, polyvinyl butyral and ethyl cellulose. These may be used alone or in combination.

The plasticizer is a component which not only controls a drying rate but also imparts flexibility to a film when later dried. The plasticizer is generally contained in the slurry in the amount of about 0-10% by mass. Examples of useful plasticizers include butylbenzyl phthalate, dioctyl phthalate, diisooctyl phthalate, dicapryl phthalate and dibutyl phthalate. These may be used alone or in combination.

The solvent is a component which renders the material into a paste and is generally contained in the amount of about 10-50% by mass. Examples of useful solvents include terpineol, methyl ethyl ketone, diethylene glycol monobutyl ether acetate and 2,2,4-trimethyl-1,3-pentadiol monoisoburyrate. These may be used alone or in combination.

The obtained slurry is sheet formed on a polyethylene terephthalate (PET) or other films having superior mechanical and thermal stability, for example, by a doctor blade technique. The resulting sheet formed article is then dried to remove the solvent and others so that it can be rendered into a green sheet.

Generally, the raw material powder accounts for about 60-95% by mass of the green sheet.

A thickness of the green sheet is preferably 30-1,500 μm, more preferably 50-1,000 μm, further preferably 100-500 μm, most preferably 150-300 μm. If the thickness of the green sheet is smaller than 30 μm, a tendency of the green sheet to separate from the support film increases. Also, such green sheets tend to become susceptible to breakage when they are laminated above each other. On the other hand, if the thickness of the green sheet is larger than 1,500 μm, cracking tends to occur when it is sheet formed.

The slurry when applied by a doctor blade preferably has a viscosity of 1-50 Pa·s, more preferably 2-30 Pa·s, further preferably 3-20 Pa·s. If the slurry viscosity is lower than 1 Pa·s, when the slurry is sheet formed, the occurrence of craters increases, as well as a variation of the film thickness tends to increase. On the other hand, if the slurry viscosity is higher than 50 Pa·s, the flowability of the slurry decreases to result in the difficulty to obtain a homogeneous film due to the formation of uneven portions or streaks on the sheet. Also, a material loss tends to increase due to the increasing amount of the slurry deposited on tubings and vessels. The slurry viscosity can be adjusted by suitably selecting the amount of a binder, plasticizer or solvent.

In the present invention, a wafer having an arbitrary thickness can be produced by laminating the obtained green sheets and then compressively bonding them with heat. A total number of the green sheets laminated may be suitably selected, for example, from the range of 2-100, preferably 5-50, depending on the thickness of each green sheet.

Although the green sheets having the same composition may be laminated, two or more types of green sheets having different components may be laminated in layers. Laminating the green sheet comprised mainly of the boron-containing crystallizable glass powder with the green sheet either containing a filler or comprised of an alumina powder, for example, results in the production of a boron dopant for a semiconductor which has good mechanical strength and heat resistance while maintaining its ability to vaporize boron.

The obtained green sheets are cut into a desired shape, if necessary. The green sheets may be laminated either after or before they are cut into a desired shape.

Subsequent sintering of the green sheets results in obtaining a boron dopant for a semiconductor. A sintering temperature is preferably 1,000-1,300° C., more preferably 1,100-1,200° C. A sintering time may be suitably controlled depending on the sintering temperature, for example, within the range of 0.5-10 hours or 1-8 hours.

The boron-containing crystallizable glass powder is crystallized in the sintering step. Accordingly, the resulting boron dopant for a semiconductor can maintain heat resistance when in use and control softening or deformation of wafers.

The boron dopant for a semiconductor of the present invention is characterized as having a laminated structure consisting of plural sintered body layers of an inorganic powder wherein a part or whole of the sintered body layers of an inorganic powder comprises a sintered body of an inorganic powder containing a boron-containing crystallizable glass powder. Each sintered body layer of an inorganic powder derives itself from a sintered body of the respective green sheet in the production process of the boron dopant for a semiconductor.

The structure of the boron dopant for a semiconductor of the present invention encompasses a structure in which plural layers of sintered bodies of boron-containing crystallizable glass powders having the same composition are laminated, and a structure in which plural layers of sintered bodies of two or more types of boron-containing crystallizable glass powders having different compositions are laminated. Others include a structure in which a layer of a sintered body of a boron-containing crystallizable glass powder and a layer of a sintered body of a boron-containing crystallizable glass powder including a filler are laminated, and a structure in which a layer of a sintered body of a boron-containing crystallizable glass powder and a layer of a sintered body of an alumina powder are laminated. With such structures, the boron dopant for a semiconductor can be imparted thereto good mechanical strength and heat resistance while maintaining the ability to vaporize boron.

The boron dopant for a semiconductor of the present invention preferably has a thickness of 0.5-10 mm, more preferably 1-5 mm. If the thickness of the boron dopant for a semiconductor is below 0.5 mm, its mechanical strength and heat resistance tend to deteriorate. If the thickness exceeds 10 mm, the boron dopant tends to become difficult to handle.

The boron dopant for a semiconductor is not particularly specified in shape but may be disk-like or rectangular, for example. The size of the boron dopant for a semiconductor is suitably chosen depending on the end use contemplated. The boron dopant, if its shape is disk-like, may preferably have a diameter of 50-300 mm, more preferably 100-200 mm. The boron dopant, if its shape is rectangular, may preferably have a 50-300 mm long side. As described above, the production method of the present invention enables easy production of a large-sized boron dopant for a semiconductor. Specifically, it is suitable for production of a 100 mm or larger diameter boron dopant for a semiconductor.

EXAMPLES

First Aspect of the Invention

The following examples provide a detailed description of the first aspect of the present invention but are not intended to be limiting thereof.

Table 1 shows Examples 1-5 and Comparative Example 1 with respect to the first aspect of the present invention.

TABLE 1

|  |  | Examples | | | | | Comp. |
|---|---|---|---|---|---|---|---|
|  |  | 1 | 2 | 3 | 4 | 5 | Ex. 1 |
| Glass | $SiO_2$ | 38 | 45 | 48 | 35 | 37 | 43 |
| Composition | $Al_2O_3$ | 27 | 18 | 20 | 26 | 25 | 28 |
| [mole %] | $B_2O_3$ | 23 | 30 | 20 | 35 | 28 | 20 |
|  | MgO | 2 | — | — | 2 | — | 3 |
|  | CaO | — | 7 | 6 | 2 | — | — |
|  | SrO | — | — | 3 | — | 5 | — |
|  | BaO | 10 | — | 3 | — | 5 | 6 |
| Glass and Alumina Contents of Mixed Powder [mass %] (Glass Powder/Alumina Powder) |  | 75/25 | 65/35 | 80/20 | 60/40 | 50/50 | 100/0 |
| Particle Size [μm] | Glass Powder | 2 | 4 | 3 | 5 | 7 | 3 |
|  | Alumina Powder | 2 | 1 | 3 | 2 | 8 | — |
| Dopant | $SiO_2$ | 30 | 33 | 40.5 | 24 | 21 | 43 |
| Composition | $Al_2O_3$ | 42.5 | 40 | 32.5 | 49.4 | 57 | 28 |

TABLE 1-continued

|  |  | Examples | | | | | Comp. |
|---|---|---|---|---|---|---|---|
|  |  | 1 | 2 | 3 | 4 | 5 | Ex. 1 |
| [mole %] | $B_2O_3$ | 18 | 22 | 17 | 24 | 16 | 20 |
|  | MgO | 1.5 | — | — | 1.3 | — | 3 |
|  | CaO | — | 5 | 5 | 1.3 | — | — |
|  | SrO | — | — | 2.5 | — | 3 | — |
|  | BaO | 8 | — | 2.5 | — | 3 | 6 |
| Glass and Crystal Contents [mass %] | Glass | 65 | 44 | 67 | 27 | 35 | 85 |
|  | $Al_4B_2O_9$ Crystal | 35 | 38 | 33 | 45 | 30 | 15 |
|  | Alumina Crystal | 0 | 18 | 0 | 28 | 35 | 0 |
| Size of $Al_4B_2O_9$ Crystal [μm] | Major Diameter | 5 | 8 | 5 | 7 | 8 | 1 |
|  | Minor Diameter | 0.5 | 0.7 | 0.5 | 0.7 | 0.7 | 0.1 |
| Heat Resistance [° C.] |  | >1300 | >1300 | >1300 | >1300 | >1300 | 1100 |
| Amount of $B_2O_3$ vaporized [mass %] |  | 7 | 6 | 6 | 7 | 5 | 0.8 |

First, a raw material for glass was compounded so that the glass composition specified in Table 1 can be obtained, which was subsequently placed in a platinum crucible, melted at 1,400° C.-1,650° C. for 3 hours and formed into a thin sheet article by a water-cooled roller. The formed article was crushed with a ball mill and, subsequent to addition of alcohol, subjected to wet grinding so that a median particle diameters $D_{50}$ was adjusted to the glass powder particle size specified in Table. Further, an alumina powder having the particle size specified in Table was added in the ratio specified in Table and mixed.

Subsequently, a binder (acrylic resin), a plasticizer (butylbenzyl phthalate) and a solvent (methyl ethyl ketone) were added to the mixed powder obtained to prepare a slurry. The obtained slurry was rendered into a green sheet by a doctor blade technique, dried and then cut into a predetermined size. Plural plies of the green sheets were laminated, integrally bonded by application of pressure and heat, and then sintered at 900° C.-1,300° C. to obtain a sintered body. The thus-obtained sintered body was determined for glass content, $Al_4B_2O_9$ crystal content, $Al_2O_3$ crystal content, size (major and minor diameters) of $Al_4B_2O_9$ crystals, heat resistance and amount of vaporized $B_2O_3$.

The $Al_4B_2O_9$ crystal content and $Al_2O_3$ crystal content were quantitatively determined by comparing an intensity of a diffraction peak obtained in the powder X-ray diffraction to a 100% peak intensity of each crystal. The glass content was given by [100−($Al_4B_2O_9$ crystal content+$Al_2O_3$ crystal content)].

The major and minor diameters of the $Al_4B_2O_9$ crystals were determined by observing a surface of the sintered body with SEM at 10,000× magnification and measuring a maximum major diameter and a maximum minor diameter in a visual field of observation.

The heat resistance was determined in the following fashion. The sintered body was machined into a 40×20×2 mm rectangular parallelepiped and placed on a support table with a span of 30 mm. After a load of 15 g was applied to its center, the sample was entirely heated. A temperature at which the sample started to deform was recorded as the heat resistance.

The amount of vaporized $B_2O_3$ was determined by machining the sample so as to have a surface area of 10 cm², heating the sample at 1,150° C. for 72 hours and measuring a weight loss of the sample.

As apparent from Table 1, since the samples of Examples 1-5 each showed a high $Al_4B_2O_9$ crystal content, in the range of 30-45% by mass, as well as a large major diameter of 5 μm or greater, the dopant host exhibited a high heat resistance over 1,300° C. and liberated a large amount of $B_2O_3$ vapor, 5% by mass or greater. On the other hand, since the sample of Comparative Example 1 showed a low $Al_4B_2O_9$ crystal content of 15% by mass and a small major diameter of 1 μm, the dopant host exhibited a low heat resistance of 1,100° C. and liberated a small amount of $B_2O_3$ vapor, 0.8% by mass.

Second Aspect of the Invention

The following examples provide a detailed description of the second aspect of the present invention but are not intended to be limiting thereof.

First, a raw material for glass was compounded so that the specific glass composition can be obtained which was subsequently introduced in a platinum crucible, melted at 1,400° C.-1,650° C. for 3 hours and formed into a thin sheet with a water-cooled roller. The formed body was crushed by a ball mill and, subsequent to addition of alcohol, subjected to wet grinding to adjust the median particle diameters $D_{50}$ to 2.5 μm. The resultant was provided as a starting glass powder for the boron component vaporization layer. This starting glass powder for the boron component vaporization layer was mixed with an alumina powder and compounded so as to have a specific composition of a starting powder for use in the heat resistant layer.

Subsequently, a binder (acrylic resin), a plasticizer (butylbenzyl phthalate) and a solvent (methyl ethyl ketone) were added to each starting powder to prepare a slurry. The obtained slurry was rendered into a green sheet for the boron component vaporization layer and heat resistant layer by a doctor blade technique, dried and then cut into a predetermined size. Plural plies of the green sheets were laminated, integrally bonded by application of pressure and heat, and then sintered at 900° C.-1,300° C. to obtain a dopant host. Specifically, the green sheets for the boron component vaporization layer were laminated alternately with the green sheets for the heat resistant layer so that the boron component vaporization layers constituted opposite outermost layers of the dopant host. The obtained dopant host was found to include the boron component vaporization layers and heat resistant layers having the respective compositions specified in Table 2.

The thus-obtained dopant host was determined for heat resistance and amount of vaporized $B_2O_3$. The results are shown in Table 2.

The heat resistance was determined in the following fashion. The sintered body was machined into a 40×20×2 mm rectangular parallelepiped and placed on a support table with a span of 30 mm. After a load of 15 g was applied to its center, the sample was entirely heated. A temperature at which the sample started to deform was recorded as the heat resistance.

The amount of vaporized $B_2O_3$ was determined by machining the sample so as to have a surface area of 10 cm², heating the sample at 1,150° C. for 72 hours and then measuring a weight loss of the sample.

TABLE 2

| | | Examples | | | | Comp.Ex. | |
|---|---|---|---|---|---|---|---|
| | | 6 | 7 | 8 | 9 | 2 | 3 |
| Boron | $SiO_2$ | 38 | 45 | 48 | 35 | 45 | 43 |
| Component | $Al_2O_3$ | 27 | 18 | 20 | 26 | 33 | 28 |
| Vaporization | $B_2O_3$ | 26 | 30 | 23 | 35 | 13 | 20 |
| Layer [mole %] | MgO | 2 | — | — | 2 | — | 3 |
| | CaO | — | 7 | 3 | 2 | — | — |
| | SrO | — | — | 3 | — | 4 | — |
| | BaO | 7 | — | 3 | — | 5 | 6 |
| Heat | $SiO_2$ | 23 | 22 | 13 | 9 | 19 | 22 |
| Resistant | $Al_2O_3$ | 55 | 65 | 78 | 84 | 73 | 45 |
| Layer | $B_2O_3$ | 18 | 8 | 6 | 5 | 5 | 24 |
| [mole %] | MgO | 2 | — | — | 1 | — | 3 |
| | CaO | — | 5 | — | 1 | — | — |
| | SrO | — | — | 2 | — | 2 | — |
| | BaO | 2 | — | 1 | — | 1 | 6 |
| Heat Resistance [° C.] | | >1300 | >1300 | >1300 | >1300 | >1300 | 1100 |
| Amount of $B_2O_3$ Vaporized [mass %] | | 7 | 6 | 6 | 7 | 0.8 | 5 |

As apparent from Table 2, the dopant hosts of Examples 6-9 each showed a high heat resistance of over 1,300° C. and liberated a satisfactory amount of $B_2O_3$ vapor, 6% by mass or greater. On the other hand, the dopant host of Comparative Example 2 liberated a small amount of $B_2O_3$ vapor, 0.8% by mass, due to the low $B_2O_3$ content of the boron component vaporization layer, 13% by mole. Also, the dopant host of Comparative Example 3 showed a low heat resistance of 1,100° C., due to the low $Al_2O_3$ content of the heat resistant layer, 45% by mole.

Third Aspect of the Invention

The following examples provide a detailed description of the third aspect of the present invention but are not intended to be limiting thereof.

Examples 10-14

Each sample was prepared in the following fashion. First, a raw material for glass was compounded to prepare a batch, introduced in a platinum crucible and melted at 1,600° C. for an hour for vitrification. Subsequently, the molten glass was formed into a film with a water-cooled roller, crushed by a ball mill and, subsequent to addition of alcohol, subjected to wet grinding to obtain a boron-containing crystallizable glass powder ($B_2O_3$—$SiO_2$—$Al_2O_3$ based glass containing 25% by mass of boron) with a median particle diameters $D_{50}$ of 3 μm.

Subsequently, a binder, a plasticizer and a solvent were added to the above-obtained boron-containing crystallizable glass powder to prepare a slurry having the viscosity specified in Table 3.

The slurry was introduced in a slurry dam having a blade and extruded, in the form of a film, onto a carrier film moving in a predetermined direction to thereby continuously form a green sheet having a thickness corresponding to a clearance between the blade and the carrier film.

Thereafter, the green sheet was exposed to a hot air or infrared radiation to evaporate the organic solvent contained in the green sheet and dry the green sheet. Subsequently, the green sheet was separated from the carrier sheet. Plural plies of the green sheets were laminated and integrally bonded by application of pressure and heat. Subsequently, the laminate was cut into a predetermined size and then sintered at 900° C.-1,300° C. for crystallization to obtain a sintered body (boron dopant for semiconductor) having the thickness specified in Table 3.

In Example 13, the boron dopant for a semiconductor was produced by laminating the green sheets comprised solely of the boron-containing crystallizable glass powder alternately with the green sheets comprising a raw material powder including 80% by mass of the boron-containing crystallizable glass powder and 20% by mass of the alumina powder.

In Example 14, the boron dopant for a semiconductor was produced by laminating the green sheets comprised solely of the boron-containing crystallizable glass powder alternately with the green sheets comprised of the alumina powder.

The obtained dopant hosts for semiconductor were evaluated for heat resistance according to the following procedure. Each dopant host for semiconductor was cut into a rectangular form and placed on a support table having a span of 30 mm. A 15 g load was applied to a center of the dopant host, followed by heating. The sample in its entirety was increased in temperature to 1,200° C. and further to 1,300. The sample was rated as "⊙" if it experienced no deformation at 1,300° C., "○" if it experienced no deformation at 1,200° C. but experienced deformation at 1,300° C. and "x" if it experienced deformation at 1,200° C.

Also, an appearance of the green sheet was visually inspected to ascertain the presence of cracks or streaks. The green sheet was rated as "○" if no cracks or streaks were found and "x" if cracks or streaks were found.

TABLE 3

|  | Examples | | | | |
| --- | --- | --- | --- | --- | --- |
|  | 10 | 11 | 12 | 13 | 14 |
| Type of Sheet | Boron-containing Crystallizable Glass | | | Glass/ Glass + Filler | Glass/ Alumina Sheet |
| Slurry Viscosity [Pa·S] | 4 | 2 | 20 | 10 | 10 |
| Sheet Thickness [μm] | 100 | 300 | 800 | 200 | 200 |
| Thickness of Sintered Body [mm] | 2 | 3 | 1.5 | 1.5 | 1.5 |
| Heat Resistance | ○ | ○ | ○ | ⊙ | ⊙ |
| Cracks | ○ | ○ | ○ | ○ | ○ |
| Streaks | ○ | ○ | ○ | ○ | ○ |

As clear from Table 3, the boron dopant for a semiconductor of Examples exhibited superior heat resistance. In particular, the boron dopant for a semiconductor of Example 13 in which the green sheets comprised of the boron-containing crystallizable glass powder were laminated alternately with the green sheets comprised of a raw material powder including the alumina powder, as well as the boron dopant for a semiconductor of Example 14 in which the green sheets comprised of the boron-containing crystallizable glass powder were laminated with the green sheets comprised of the alumina powder, exhibited particularly excellent heat resistance. Also, no cracks or streaks were found in the green sheets of the boron dopant for a semiconductor of each Example.

Examples 15-17

A 200 μm thick green sheet was obtained by the same production method as in Examples 10-14. The slurry viscosity was 10 Pa·s.

The obtained green sheets were laminated and integrally bonded under heat and pressure. Subsequently, the resultant was cut into a wafer form having a diameter of 150 mm and then sintered at 900-1,300° C. for crystallization to obtain a sintered body having the thickness specified in Table 4.

In Example 15, the boron dopant for a semiconductor was produced by laminating green sheets comprised of a raw material powder containing 80% by mass of the boron-containing crystallizable glass powder and 20% by mass of the alumina powder.

In Examples 16 and 17, the boron dopant for a semiconductor was produced by laminating green sheets comprised solely of the boron-containing crystallizable glass powder alternately with green sheets comprised of the alumina powder.

The obtained boron dopant for a semiconductors were tested for heat resistance according to the following procedure.

Each boron dopant for a semiconductor was placed on a quartz boat, heated up to 1,150° C. in a heat-treating furnace, maintained at the temperature for 10 hours and then cooled down to room temperature. This heating profile was repeated 10 times and then warpage of the boron dopant for a semiconductor was observed. Warpage of the boron dopant for a semiconductor was measured by allowing the boron dopant for a semiconductor to stand on a surface plate and inserting a clearance gauge in a clearance gap between an outer peripheral portion of the boron dopant for a semiconductor and the surface plate. The boron dopant for a semiconductor was rated as "○" if its warpage was less than 1 mm and "x" if its warpage was not less than 1 mm. The results are shown in Table 4.

Comparative Example 4

First, a raw material for glass was compounded to prepare a batch. The batch was placed in a platinum crucible and then melted at 1,600° C. for an hour for vitrification. Subsequently, the molten glass was cast in a mold and then annealed to obtain a cylindrical cast body ($B_2O_3$—$SiO_2$—$Al_2O_3$ based glass having a boron content of 25% by mass). The obtained cast body was subjected to a heat treatment to crystallize a glass, and then cut into a configuration having the diameter and thickness specified in Table 4 to obtain a boron dopant for a semiconductor.

The obtained boron dopant for a semiconductor was tested for heat resistance in the same manner as in Examples 15-17. The result is shown in Table 4.

TABLE 4

|  | Examples | | | Comp. |
| --- | --- | --- | --- | --- |
|  | 15 | 16 | 17 | Ex. 4 |
| Production Process | Green Sheet Process | | | Cast Process |
| Type of Sheet | Glass + Filler | Glass/ Alumina Sheet | Glass/ Alumina Sheet | — |
| Diameter [mm] | 150 | 150 | 150 | 150 |
| Thickness [mm] | 3 | 2 | 1.2 | 3 |
| Warpage | ○ | ○ | ○ | X |

As can be clearly seen from Table 4, large-sized boron dopant for a semiconductors having good heat resistance are obtained in Examples 15-17. In particular, those of Examples 16 and 17 exhibited good heat resistance in spite of their small thicknesses of not greater than 2 mm. On the other hand, the boron dopant for a semiconductor of Comparative Example 4 exhibited poor heat resistance in spite of its thickness of 3 mm.

The invention claimed is:

1. A dopant host characterized in that it comprises a laminate including a boron component vaporization layer having a composition comprising 30-60% by mole of $SiO_2$, 10-30% by mole of $Al_2O_3$, 15-50% by mole of $B_2O_3$ and 2-10% by mole of RO, wherein R denotes an alkaline earth metal, and a heat resistant layer having a composition comprising 8-30% by mole of $SiO_2$, 50-85% by mole of $Al_2O_3$, 5-20% by mole of $B_2O_3$ and 0.5-7% by mole of RO, wherein R denotes an alkaline earth metal.

2. The dopant host as recited in claim 1, characterized in that it includes the boron component vaporization layer as an outermost layer.

3. The dopant host as recited in claim 1, characterized in that it is made by sintering a laminate of green sheets.

4. The dopant host as recited in claim 2, characterized in that it is made by sintering a laminate of green sheets.

* * * * *